US008816717B2

(12) United States Patent
Fritz et al.

(10) Patent No.: US 8,816,717 B2
(45) Date of Patent: Aug. 26, 2014

(54) REACTIVE MATERIAL FOR INTEGRATED CIRCUIT TAMPER DETECTION AND RESPONSE

(71) Applicant: International Business Machines Corporation, Armonk, NY (US)

(72) Inventors: Gregory M. Fritz, Yorktown Heights, NY (US); Chung H. Lam, Peekskill, NY (US); Dirk Pfeiffer, Croton on Hudson, NY (US); Kenneth P. Rodbell, Sandy Hook, CT (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 13/653,996

(22) Filed: Oct. 17, 2012

(65) Prior Publication Data

US 2014/0103957 A1    Apr. 17, 2014

(51) Int. Cl.
    *H03K 19/00*    (2006.01)
(52) U.S. Cl.
    USPC .................................. 326/8; 257/417; 705/57
(58) Field of Classification Search
    USPC ....................... 326/8, 37, 38; 257/417; 705/57
    See application file for complete search history.

(56) References Cited

U.S. PATENT DOCUMENTS

| | | | |
|---|---|---|---|
| 3,666,967 A | 5/1972 | Keister et al. | |
| 3,882,323 A | 5/1975 | Smolker | |
| 5,042,386 A | 8/1991 | Kruse et al. | |
| 5,159,629 A | 10/1992 | Double et al. | |
| 5,486,707 A | 1/1996 | Look et al. | |
| 5,698,812 A | 12/1997 | Song et al. | |
| 5,723,358 A | 3/1998 | Manley et al. | |
| 5,776,235 A * | 7/1998 | Camilletti et al. | 427/96.2 |
| 5,821,558 A | 10/1998 | Han et al. | |
| 5,970,372 A | 10/1999 | Hart et al. | |
| 6,087,677 A | 7/2000 | Wu et al. | |
| 7,502,256 B2 | 3/2009 | Merry, Jr. et al. | |
| 7,880,248 B1 * | 2/2011 | Pham et al. | 257/417 |
| 7,898,855 B2 | 3/2011 | Merry, Jr. et al. | |
| 7,936,603 B2 | 5/2011 | Merry, Jr. | |
| 7,982,488 B2 | 7/2011 | Nirschl et al. | |
| 2004/0034782 A1 | 2/2004 | Park et al. | |
| 2006/0049256 A1 * | 3/2006 | von Mueller et al. | 235/449 |
| 2006/0102982 A1 | 5/2006 | Park et al. | |

(Continued)

OTHER PUBLICATIONS

J.M. Benedetto, C.C. Hafer, A. R. Oliver, and D.B. Kerwin, "Amorphous Silicon Antifuse Programmable-Array-Logic Devices for High Relilability Space Applications" consists of 4 pages.

(Continued)

*Primary Examiner* — Don Le
(74) *Attorney, Agent, or Firm* — Louis Percello

(57) ABSTRACT

The present disclosure relates to integrated circuits having tamper detection and response devices and methods for manufacturing such integrated circuits. One integrated circuit having a tamper detection and response device includes at least one reactive material and at least one memory cell coupled to the at least one reactive material. An exothermic reaction in the at least one reactive material causes an alteration to a memory state of the at least one memory cell. Another integrated circuit having a tamper detection and response device includes a substrate, at least one gate on the substrate, and a reactive material between a first well and a second well of the at least one gate. A reaction in the reactive material causes a short in the gate.

24 Claims, 6 Drawing Sheets

(56) References Cited

U.S. PATENT DOCUMENTS

| | | |
|---|---|---|
| 2008/0223932 A1* | 9/2008 | Mueller et al. .............. 235/449 |
| 2010/0225380 A1 | 9/2010 | Hsu et al. |
| 2011/0078933 A1 | 4/2011 | Lukawitz et al. |
| 2011/0226148 A1 | 9/2011 | Sawka et al. |
| 2013/0089943 A1 | 4/2013 | Chen et al. |
| 2013/0117138 A1* | 5/2013 | Hazel et al. .................. 705/16 |

OTHER PUBLICATIONS

Jae Sung Lee, Young Hyun Lee, "Metal-to-Metal Antifuse with Amorphous Ti-Rich Barium Titanate Film and Silicon Oxide Film". Solid State, Electronics 43 (1999) pp. 469-472.

S.H. Fischer, M.C. Grubelich, "A Survey of Combustible Metals Thermites, and Intermetallics for Pyrotechnic Applications" pp. 1-13.

S. Raoux, G.W. Burr, M.J. Breitwisch, C.T. Rettner, Y.C. Chen, R.M. Shelby, M. Salinga, D. Krebs, S.H. Chen, H.L. Lung, C.H.Lam. "Phase-change Random Access Memory: A Scalable Technology" IBM J Res. & Dev. vol. 52 No. 4/5 Jul./Sep. 2008. pp. 465-479.

A.J. Gavens, D. Van Heerden, A.B. Mann, M.E. Reiss, and T.P. Weihs "Effect of Intermixing on Self-Propagating Exothermic Reactions in Al/Ni Nanolaminate Foils" Journal of Applied Physics, vol. 87.No. 3, Feb. 2000. pp. 1255-1263.

Y.N. Picard, J.P. McDonald, T.A. Friedmann, S.M. Yalisove, D.P. Adams "Nanosecond Laser Induced Ignition Thresholds and Reaction Velocities of Energetic Bimetallic Nanolaminates" Applied Physics Letters 93 (2008) pp. 104104-1-104104-3.

R. Knepper, M.R. Snyder, G. Fritz, K. Fisher, Omar M. Knio, T.P. Weihs, "Effect of Varying Bilayer Spacing Distribution on Reaction Heat and Velocity in Reactive Al/Ni Multilayers" Journal of Applied Physics 105 (2009) pp. 083504-1-083504-9.

J. Braeuer, J. Besser, M. Wiemer, T. Gessner, "Room-Temperature Reactive Bonding by Using Nano Scale Multilayer Systems" Transducers' 11, Beijing, China, Jun. 5-9, 2011. pp. 1332-1335.

C. Rossi, K. Zhang, D. Estève, P. Alphonse, P. Tailhades, C. Vahlas, "Nanoenergetic Materials for MEMS: A Review" Journal of Microelectromechanical Systems, vol. 16, No. 4, Aug. 2007. pp. 919-931.

D. Schellekens, P. Tuyls, B. Preneel, "Embedded Trusted Computing with Authenticated Non-Volatile Memory" Trust 2008, LNCS, pp. 60-74.

S.W. Smith, S. Weingart, "Building a High-Performance, Programmable Secure Coprocessor" Revised Feb. 17, 1998, consist of 10 pages and numbered pp. 1-51.

G.E. Suh, S. Devadas, "Physical Unclonable Functions for Device Authentication and Secret Key Generation" DAC 2007, consists of 6 pages.

T. Matsumoto, S. Nakajima, T. Shibata, A. Yamagishi,"Studying LSI Tamper Resistance with Respect to Techniques Developed for Failure Analysis" Sep. 2005, consists of 13 pages.

S.P. Skorobogatov, R.J. Anderson, "Optical Fault Induction Attacks" CHES 2002, LNCS 2523, pp. 2-12 2003.

O. Kömmerling, M.G.Kuhn, "Design Principles for Tamper-Resistant Smartcard Processors" May 1999 USENIX Association, pp. 1-12.

L. Teyssier, "Strong Encryption and Correct Design are not Enough: Protecting Your Secure System from Side Channel Attacks" 2010, pp. 1-18.

M. Meterelliyoz, P. Song, F. Stellari, J. Kulkarni, K. Roy, "A High Sensitivity Process Variation Sensor Utilizing Sub-Threshold Operation" 2006, pp. 125-128.

N. Papandreou, H. Pozidis, T. Mittelholzer, G.F. Close, M. Breitwisch, C. Lam, E. Eleftheriou, "Drift-Tolerant Multilevel Phase-Change Memory" 2011 consists of 4 unnumbered pages.

* cited by examiner

200

PHASE CHANGE MEMORY 200 IN "SET" STATE

PHASE CHANGE MEMORY 200 IN "RESET" STATE

300

REACTIVE MATERIAL FOR INTEGRATED CIRCUIT TAMPER DETECTION AND RESPONSE

FIELD OF THE DISCLOSURE

The present disclosure relates to integrated circuits, and more particularly to detecting tampering and reverse engineering of integrated circuits.

BACKGROUND OF THE DISCLOSURE

Hardware based "Root of Trust" is a fundamental building block for any secure computing system. Key elements of secure computing require authentication, sending data to an authorized source, and/or loading data onto a designated device. In general, cryptographic keys in binary code form the basis of securing data and bit streams. Typically, such cryptographic keys are stored in non-volatile memory and are present on an integrated circuit (IC) at all times. If an attacker can extract the key from a device, the entire foundation for secure computing is in jeopardy. For example, an attacker with physical access to a device can delayer the chip and read out the stored code based on the state of the transistors. Thus, securing cryptographic keys requires anti-tamper technologies. For example, an anti-tamper mesh may surround a printed circuit board and may include a tamper sensor chip and its own battery pack to deter such attacks. If the sensor detects that the mesh is being cut, the cryptographic code is erased. However, such anti-tamper technologies may be relatively expensive and may therefore not be suitable for implementation in mass produced, cost sensitive devices like field programmable gate arrays (FPGAs), mobile devices, and sensors.

SUMMARY OF THE DISCLOSURE

Embodiments of the present disclosure describe integrated circuits having tamper detection and response devices and methods for manufacturing such integrated circuits. For example, an integrated circuit having a tamper detection and response device includes at least one reactive material and at least one memory cell coupled to the at least one reactive material. An exothermic reaction in the at least one reactive material causes an alteration to a memory state of the at least one memory cell. Likewise, a method for manufacturing an integrated circuit having a tamper detection and response device comprises forming at least one reactive material in the integrated circuit, fabricating at least one memory cell in the integrated circuit, and coupling the at least one reactive material to the at least one memory cell. An exothermic reaction in the at least one reactive material causes an alteration to a memory state of the at least one memory cell.

In another embodiment, an integrated circuit having a tamper detection and response device includes a substrate, at least one gate on the substrate, and a reactive material between a first well and a second well of the at least one gate. A reaction in the reactive material causes a short in the gate. Similarly, a method for manufacturing an integrated circuit having a tamper detection and response device comprises forming at least one gate on a substrate of the integrated circuit and depositing a reactive material between a first well and a second well of the gate. A reaction in the reactive material causes a short in the gate.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

Embodiments of the present disclosure present a novel on-chip anti tamper device for detecting physical tampering as well as for providing a tamper response by erasure of data. Exemplary components include miniaturized photovoltaic cells (PV) integrated into the back end of the line (or backend) interconnect structure at various levels, non-volatile memory (NVM) (e.g., phase change memory (PCM)) to store sensitive data, such as secret authentication codes, and an embedded reactive material (RM), which may comprise a multilayer thin film metal stack that reacts when triggered by a current pulse generated from the photovoltaic (PV) elements. Notably, many physical reverse engineering techniques require accessing the chip structures through imaging (e.g., electron beams from scanning electron microscopy (SEM), focused ion beam (FIB), x-ray, etc.) and therefore generate radiation (e.g., photocurrent, laser beam induced current (LBIC), electron beam induced current (EBIC), and the like). Embodiments of the present disclosure exploit this principle by using the miniature photovoltaic PV cells to convert the radiation from a tampering attempt into a current which triggers the tamper response (e.g., either directly or through an exothermic reaction generated in the reactive material) to erase the data.

Tampering/attacks range from electrical probing and delayering for extracting secret keys to inducing faults (e.g. flipping states) in order to force an integrated circuit to conduct unauthorized operations. An attacker typically needs to deploy a range of techniques in order to locate specific circuits and structures which usually involve radiation for imaging or inducing currents and faults. Table 1 illustrates several failure analysis/tampering techniques.

TABLE 1

| Failure Analysis technique | Radiation involved |
| --- | --- |
| Delayering by ashing, polishing | Requires optical microscope to stop at a specific layer |
| Single and dual beam focus ion beam | Ga ion beam for FIB cuts (produce secondary electrons) Scanning electron microscope (e-beam up to 30 KeV) |
| Electron beam induced current (EBIC), electron beam probing | Scanning electron microscope (e-beam up to 30 KeV) |
| Laser techniques: laser voltage probing, optical beam induced current (OBIC), thermal e.g. | Lasers wavelength up to 1.3 microns |

TABLE 1-continued optical beam induced resistance
change (OBIRCH)
X-Ray tomography          X-Ray ranging from 50-200 keV Embodiments of the present disclosure are compatible with standard metal oxide semiconductor (MOS) chip fabrication techniques, thereby reducing the cost per die during implementation and integration of such embodiments. Furthermore, the security against physical tampering is increased compared to packaging based approaches due to miniaturization and containment within the chip. In addition, the on-chip anti-tamper devices of the present disclosure may also be implemented with established hardware security products.

Figure 1:
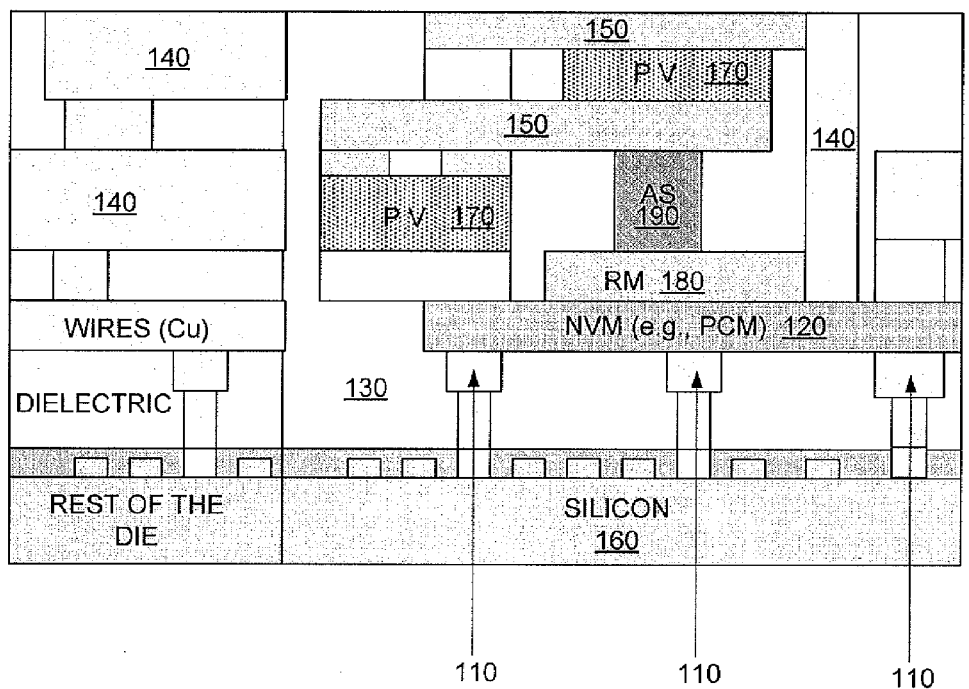
FIG. 1 illustrates an exemplary device, according to embodiments of the present disclosure.

To aid in understanding the present disclosure, FIG. 1 illustrates a cross-section of an exemplary device 100 (e.g., an integrated circuit) related to embodiments of the present disclosure. In particular, device 100 includes a substrate or die 160, which may be comprised of crystalline silicon (Si), germanium (Ge), SiGe, gallium arsenide (GaAs), or other semiconductors, as well as other materials for forming transistors, resistors, capacitors and other structures. Although the example of FIG. 1 refers to a die 160, the present disclosure is not so limited. For example, the die may be one of many dies that may be formed from a common substrate or wafer. Thus, embodiments of the present disclosure may incorporate a substrate prior to separation of multiple dies. In any case, the die 160, which forms part of the front end of the integrated circuit, may have a number of structures formed thereon, such as an array of one or more gates 110. In one embodiment, the array of gates 110 may comprise a number of transistors that form a non-volatile memory 120 (e.g., random-access memory (RAM), static random-access memory (SRAM), and the like). For example, each of the gates 110 may comprise an n-type or p-type field effect transistor, or any number of other similar structures. Alternatively, or in addition, the non-volatile memory 120 may comprise a phase change memory (PCM). Exemplary phase change memory devices are discussed in further detail below in connection with FIG. 2. In one embodiment, the non-volatile memory 120 stores sensitive data to be protected by the tamper detection and response device(s) of the present disclosure.

The backend of device 100 is a multi-layer interconnect structure which includes wiring for transporting signals between transistors, gates and other structures in the front end and supply voltages, ground, and C4s (solder bumps), in the package. For example, the backend of a typical integrated circuit may include insulating materials, e.g., dielectric 130, which may comprise a low-k dielectric material such as borophosphosilicate glass, and copper (Cu) or tungsten (Tu) wiring formed in vias 140 and traces 150.

According to various embodiments of the present disclosure, device 100 also includes one or more photovoltaic (PV) cells 170 which may be connected by way of wiring in the traces 150 and vias 140 in the backend of the device 100 to the non-volatile memory 120 and/or a reactive material (RM) 180. In particular, the photovoltaic cells 170 (or the photovoltaic cells in combination with the reactive material 180) comprise a tamper detection and response device for protecting the non-volatile memory 120. However, in another embodiment device 100 also includes one or more regions of reactive material 180 which may be connected by way of wiring in the traces 150 and vias 140 in the backend of the device 100 to the non-volatile memory 120 and/or one or more photovoltaic (PV) cells 170. In particular, the reactive material 180 (or the reactive material in combination with the photovoltaic cells 170) comprises the tamper detection and response device. In one embodiment, the reactive material (RM) 180 comprises a multilayer thin film metal stack that causes an exothermic reaction when triggered by a current pulse generated from one or more of the photovoltaic cells 170. It should be noted that although FIG. 1 illustrates photovoltaic cells 170 and reactive material 180 in the backend of device 100, the present disclosure is not limited to integration in the back-end only. Namely, in other, further and different embodiments, one or more photovoltaic cells 170 and/or reactive material 180 may be located at the transistor level or in the front-end at the silicon level (e.g., on, at, or near the substrate, or die 160), which may be useful in preventing intrusion and tampering attempts via the front-end. For example, silicon-on-insulator (SOI) based substrates can be used to fabricate photovoltaic cells by integrating a P—N junction into the silicon body as well as contacts on both sides of the silicon body.

Although the embodiment of FIG. 1 includes a reactive material (RM) 180 as part of the tamper detection and response device, it should be noted that various embodiments are configured to directly erase one or more bits, i.e., without the use of a reactive material, via a direct electrical current from the photovoltaic cell(s) 170 to the non-volatile memory 120 and/or one or more of the gates 110. For example, in some embodiments a current pulse between 200-500 µA for several nanoseconds is sufficient to erase/reset each bit of a phase change memory. Depending on the size of a particular photovoltaic cell 170 and/or the quantity and type of incident radiation, the photovoltaic cell may generate currents in this range.

In embodiments that feature a reactive material 180, the thin metal film of the reactive material 180 spontaneously mixes in selective areas where current flows. Alternatively, or in addition, the reactive material 180 provides a self-propagating exothermic reaction set off by a current pulse at a single site. In any case, both reaction mechanisms generate sufficient heat, which causes the non-volatile memory 120 to change memory state, reset or to melt, leading to irreversible erasure of any bits representing sensitive data, like cryptographic keys. For instance, in embodiments which employ a non-volatile memory comprising a phase change memory (PCM), the reaction heat sets or resets a PCM cell if the reactive material is in close proximity to the PCM array. This is due to the reaction heat affecting the PCM phase (amorphous vs. crystalline). After erasure, there is no way to reverse engineer the bits, while the remaining portion of the integrated circuit (device 100) remains intact. In some embodiments, the heat generated by reactive material 180 is sufficiently high to destroy all or part of non-volatile memory 120 (which, in some embodiments, may comprise a phase change memory).

In some embodiments, scaling and substrate effects, like heat loss, may potentially lead to quenching of the reaction in reactive material 180. Thus, in some embodiments the reactive material 180 may be situated sufficiently close to the non-volatile memory 120 to deliver sufficient heat to destroy or reset the non-volatile memory 120. Alternatively, or in addition, the reaction temperature of the reactive material is increased to deliver sufficient heat to destroy or reset the non-volatile memory 120 over a relatively greater distance within the device 160. Advantageously, the reactive material 180 stores energy on-chip that is benign during normal chip operations, but which can be triggered by a low current pulse. This is contrary to traditional tamper schemes with on-chip batteries requiring a constant power, where the tamper detection and response circuitry must be kept operational throughout the lifetime of the die. Exemplary reactive materials and thin-film metal stacks are discussed in further detail below in connection with FIG. 3.

In one embodiment, a plurality of photovoltaic cells 170 are placed at various locations and in various levels of the interconnect structure of device 100. Notably, an attacker employing one or more reverse engineering techniques, such as focused ion beam (FIB) or x-ray tomography, may begin tampering/probing at various locations of the device 100. To address the uncertainly as to the exact location where an attacker will begin, or where the attacker will proceed, burying photovoltaic cells 170 at various locations and using multiple photovoltaic cells increases the likelihood that a probing attack is detected and that the non-volatile memory 120 is destroyed at an earlier instance. Similarly, by placing a plurality of photovoltaic cells 170 at different levels in the interconnect structure, the tamper response device is more likely to detect/prevent an intrusion via delayering and other techniques at any given layer of the device 100. In addition, in some embodiments, for example in a large array, the location (s) of one or more photovoltaic cells 170 can be varied, randomly or otherwise, so that from one device to the next, the location(s) of the photovoltaic cells 170 are not necessarily the same. Thus, an attacker may not know where to avoid photovoltaic cells going from chip to chip, increasing the difficulty of an attacker's task many-fold.

Furthermore, in some embodiments the composition or material(s) used for photovoltaic cells 170 may be chosen based on their potential effectiveness to correspond to tampering from techniques employing radiation of different wavelengths. Notably, tamper techniques utilize a wide range of incident radiation for imaging, which can vary from ultraviolet (UV) visible to near-infrared (IR) (see Table 1). Thus, including multiple photovoltaic cells 170 with various materials can provide a way to detect probing at different wavelengths. For example, a first photovoltaic cell 170 may comprise a particular material (such as amorphous silicon, crystalline silicon, silicon germanium, germanium, indium gallium arsenide, indium arsenide or other material) while a second photovoltaic cell 170 may comprise a second, different material (e.g., selected from the same group). Each of these two materials may therefore have different quantum efficiencies at the same wavelength of incident radiation and provide a different response to one or more probing techniques. For example, one material may generate a strong current in response to irradiation by a laser at a particular wavelength, whereas the second material generates a weaker response to the same laser wavelength, but may show a strong response to x-rays.

Alternatively, or in addition, one or more dimensions, dopant concentrations, or other properties may be varied between at least two photovoltaic cells 170 included in device 100, which also results in different wavelength responses to the stimuli of various probing techniques. For example, tuning the absorption of a photovoltaic cell 170 can be achieved by involving proper materials engineering (e.g., varying the absorption coefficient and/or band gap). Similarly, decreasing the size of a cell generally increases efficiency. For instance, an approximately 16 mA/cm$^2$ (milliampere per square centimeter) photocurrent has been observed for an approximately 1.2 mm$^2$ (square millimeter) amorphous silicon photovoltaic cell, demonstrating that photocurrent at small dimensions can be substantial. In any case, the inclusion of photovoltaic cells 170 having various responses to stimuli of various wavelengths addresses circumstances where it is unknown which particular probing technique(s) an attacker will use. By including at least a first photovoltaic cell 170 that is strongly reactive to a particular first probing technique and at least a second photovoltaic cell 170 that is more strongly reactive to a second, different probing technique, the device 100 is more robust and stands a greater chance of detecting and preventing an attack using a random probing technique, or a multi-faceted attack using several different probing techniques.

The incident radiation of typical tampering/probing techniques can be significant. If a photovoltaic cell, such as a photovoltaic cell 170, is exposed to microscope light during delayering, input estimates are about 30 to 60 mA/cm$^2$ with a $J_{PH}i$ (photocurrent density, which depends on quantum efficiency) of 10-15 mA/cm$^2$ for Si and $J_{PH}i$ 20 mA/cm$^2$ for Ge. Lasers are known to generate laser beam induced current (LBIC) on junctions. The photocurrent for a LBIC is given by $J_{PH}i=0.8$ mA/cm$^2 \times QE \times \#mW \times k(laser)$, where $\#mW$ is the laser power in milliwatts, QE is the quantum efficiency and k is the wavelength in microns. Since lasers used by microanalysis techniques range from 100 to 500 mW with wavelengths of 1-1.3 microns, depending on the absorption coefficient and the band gap of the material of the photovoltaic cell 170, the photocurrents can be significant (e.g., sufficient to meet or exceed the 200-500 µA for several nanoseconds which is sufficient to erase/reset each bit of a phase change memory). In addition, electron beams from a scanning electron microscope (SEM), x-ray, and focused ion beam will generate substantial current, based on the electron beam induced current (EBIC) effect. Therefore, photovoltaic cells can respond effectively to a wide range of imaging techniques deployed in tampering. Furthermore photocurrent generation is almost instantaneous which is particularly advantageous since current generation has to occur before an attacker has time to disable any anti-tamper elements.

In some embodiments, device 100 also includes an anti-fuse, or arming switch (AS) 190 that may be situated in an electrical path (e.g., in a trace 140 and/or via 150) between the photovoltaic cells 170 and the non-volatile memory 120 and/ or the reactive material 180. As described herein, the term anti-fuse encompasses a class of devices that is intended to prevent a flow of current when armed, or when in an activated state, and to allow a flow of current when disarmed, or placed in a deactivated state. In other words, an anti-fuse essentially operates in the reverse of a typical fuse which allows a flow of current until the fuse breaks (e.g., by an over-current or over-voltage) and the flow of current is prevented. One particular application of an anti-fuse is as an arming switch, which is designed to prevent a flow of current until a deactivation or disarming signal, is received. However, it should be understood that an arming switch is only one embodiment of an anti-fuse according to the present disclosure, which may have other applications, such as for use in a field programmable gate array. Specifically, in one embodiment the arming switch 190 may comprise an anti-fuse that prevents current flow from the photovoltaic cells 170 to the reactive material 180 during the fabrication of the device 100. Since the photovoltaic cells 170 may be exposed to light until they are completely sealed off within the interconnect structure, the anti-fuse/arming switch 190 may sufficiently prevent any unintentional current from flowing from one or more of the photovoltaic cells 170. A one-time irreversible deactivation step converts a particular material in the anti-fuse from a high resistance to a low resistance state, enabling current flow if the chip structure is exposed to radiation again during tampering. Exemplary anti-fuses, arming switches, and materials that may be used in such devices, are discussed in further detail below in connection with FIG. 4.

Figure 2:
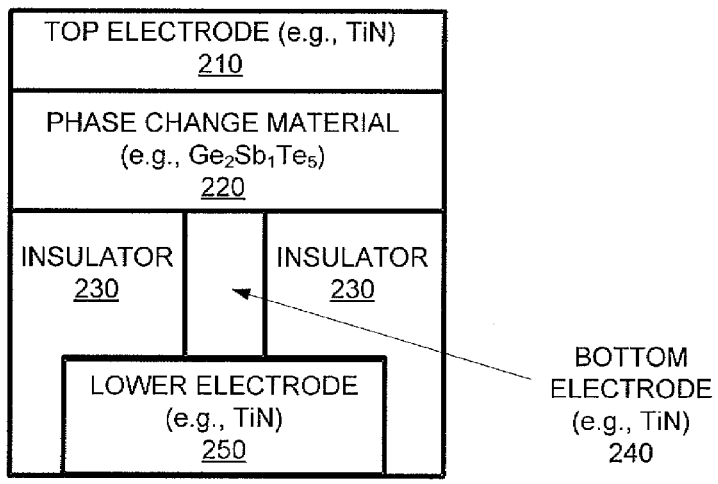
FIG. 2 illustrates an exemplary phase change memory cell in "set" and "reset" states, according to embodiments of the present disclosure.
Figure 2:
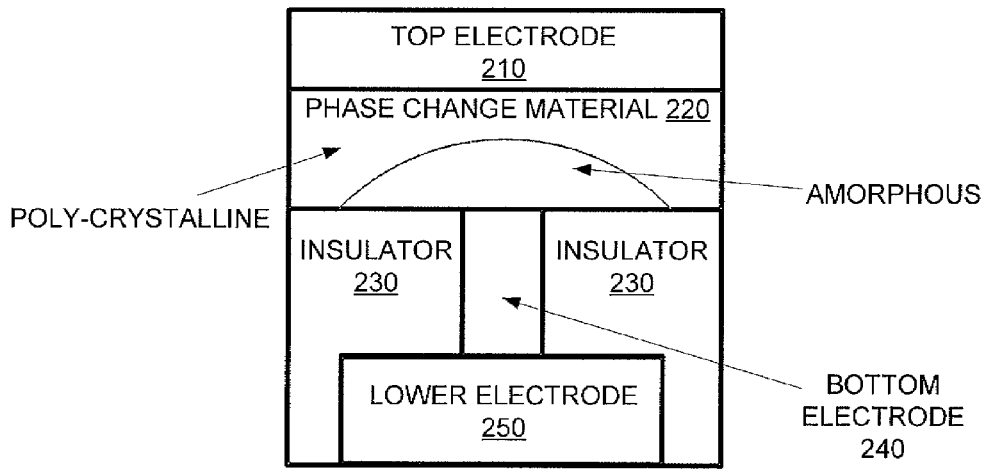

FIG. 2 illustrates an exemplary phase change memory cell 200 according to various embodiments of the present disclosure. For example, the top of FIG. 2 shows the phase change memory cell 200 in a "set" state, while the bottom of FIG. 2 shows the same phase change memory cell 200 in the "reset" state. The exemplary phase change memory cell 200 includes a top electrode 210, a bottom electrode 240 and a lower electrode 250, each of which may comprise titanium nitride (TiN) or other suitable materials, as are known to those skilled in the art. The phase change memory cell 200 further includes an insulator 230 and a phase change material 220 which can change phase from polycrystalline (e.g., the "set" state) to amorphous (e.g., the "reset" state) as well as take one or more intermediate states. For example, the "set" and "reset" states may be achieved using single pulses, whereas two intermediate levels may be programmed using iterative write-and-verify steps. Each programming pulse is a box-type rectangular pulse. The "reset" pulse may comprise a high current, while the "set" pulse may comprise a trapezoidal pulse of long trailing edge that permits sufficient crystallization.

The phase change material 220 may comprise a chalcogenide glass or other material which changes crystallographic phase when exposed to a laser. For example, a chalcogenide glass may exhibit wide resistance ranges between crystalline and amorphous states. In general, a chalcogenide includes one or more elements from group 16 of the periodic table, such as sulfur, selenium, or tellurium. Thus, in various embodiments, one or more of the gates 110 may be comprised of doped $Ge_2Sb_2Te_5$, AsS, $As_2S_3$, and various other phase change materials.

While some embodiments of the present disclosure may employ other types of non-volatile memory, phase change memory has particular advantages which make it a suitable choice for use in a secure device according to the present disclosure. More specifically, from a physical anti-tamper perspective phase change memory does not give off any electromagnetic signature. Therefore, reading out the memory states can only be accomplished by direct probing and imaging, which requires physical access to the phase change memory. Once a reactive material has ignited and melted the phase change memory, there is no way to read out the bits since the physical attributes of the material have been changed. This is different from SRAM and other technologies, where it is possible to read out the last state due to imprinting, even after the chip power is turned off. On the other hand, metal oxide semiconductor based memory cells may be advantageous in some application because metals, such as aluminum (which may be used in exemplary reactive materials), cause significant reactions with dielectrics such as silicon dioxide, silicon nitride, and high-K gate dielectrics, reacting with oxygen and forming stable oxides. Thus, there is significant potential for extensive gate/memory cell destruction when such materials are used.

Figure 3:
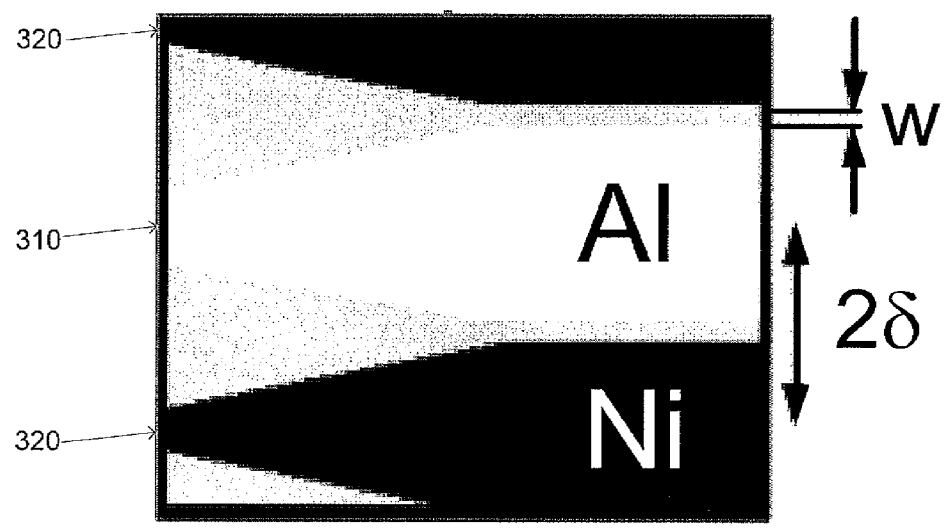
FIG. 3 illustrates an exemplary reactive material (e.g., a thin metal stack), according to embodiments of the present disclosure.

FIG. 3 illustrates an exemplary reactive material 300, according to various embodiments of the present disclosure. In some embodiments, reactive material 300 is included in an integrated circuit (e.g., device 100) which provides a way to store the required amount of energy for irreversible erasure of memory cells on the chip through an exothermic reaction. In particular, in many cases the radiation of a given tamper event may be insufficient to generate a large enough current pulse from one or more integrated photovoltaic cells to directly alter, e.g., erase or destroy, the non-volatile memory, whereas the reactive material 300 may have a steep chemical gradient and require only an ultra low trigger current to release the energy. In one embodiment, the exothermic reaction irreversibly destroys all or a portion of a non-volatile memory (e.g., one or more gates 110 of non-volatile memory 120 in FIG. 1), providing unmistakable evidence of tampering. In one embodiment, the reactive material is deposited in at least one continuous layer adjacent to the non-volatile memory or sufficiently close to alter the non-volatile memory, e.g., to change the memory state of the non-volatile memory or to damage or destroy it such that it is no longer useable as a memory.

As illustrated in FIG. 3, reactive material 300 comprises a thin metal film stack of several metallic layers where w is the interlayer spacing and 2σ is the bilayer thickness or spacing (which is also sometimes referred to as λ). For example, the reactive material 300 comprises one or more specific metals such as copper, copper oxide, aluminum, nickel, hafnium oxide, silicon, boron, titanium, cobalt, palladium, platinum, and/or other metallic structures. As shown in FIG. 3, the stack 300 includes an aluminum layer 310 sandwiched between two nickel layers 320. Advantageously, the reactive material 300 stores energy on-chip that is benign during normal chip operations, but which can be triggered by a low current pulse. This is contrary to traditional tamper schemes with on-chip batteries requiring a constant power since the tamper detection and response circuitry has to be kept operational throughout the lifetime of the die. In addition, current based ignition is potentially only needed on a single site/contact of the reactive material 300. In particular, a reaction self-propagates in free standing foils and similarly will sustain a self-propagating reaction front on the chip. Furthermore, if the heat loss away from the reactive material 300 to the surrounding chip environment quenches the reaction, bit erasure can still be accomplished by exothermic reaction in reactive material regions exposed to current flows. The current to drive the reaction without a self sustaining reaction front is still lower the current required for direct bit erasure. For example, ignition current may be substantially lower than that required to directly reset the non-volatile memory (e.g., nano-amperes versus micro-amperes).

In various embodiments, the ignition temperature and heat of reaction are tuned/adjusted to requirements of the particular manufacturing environment. In particular, the reactive material 300 must be inert during processing and survive normal chip operation and stress tests, but be sensitive enough to ignite during tampering and provide sufficient heat to destroy or erase non-volatile memory cells. It has been shown, for example, that in a titanium/amorphous-silicon stack, with a bilayer spacing of 75 nm deposited on 1 µm of silicon oxide on silicon, the reaction quenches when the reactive material thickness is less than 2.25 µm. Thus, in some embodiments the potential for reaction quenching is taken into account in providing a reactive material 300 that generates a sufficient reaction front that will not be quenched prior to destroying the non-volatile memory. In some cases, the ignition threshold and heat of the reaction is varied by changing of the chemistry, stoichiometry, and microstructure (grain structure and line spacing in thin films comprising the stack of reactive material 300). For instance, the number of layers, the spacing between layers, the width of the layers and the component metals in the stack of reactive material 300, can all be varied, resulting in different ignition fluences (current densities required for ignition), different reaction heats, etc. In some embodiments, the ignition current density can also be varied via lithography, such as by varying of the size of the electrical contacts/vias connected to the stack of reactive material 300. For example, a connection from a first photovoltaic cell may be fabricated with electrical contacts having a different cross-sectional area than electrical contacts for a connection from a second photovoltaic cell. Accordingly, the current densities delivered from the first and second photovoltaic cells may be different from one another despite, for example, the first and second photovoltaic cells being otherwise the same and receiving the same incident radiation. Similarly, in embodiments employing oxide systems, such oxides can be made porous by producing nanoparticles of different sizes. Likewise, the potential for reaction quenching can be reduced by fabricating specific patterns and geometries for the reactive material 300, or one or more layers thereof, through lithography, undercutting, chemical mechanical planarization, and other similar techniques, in order to promote self-propagation by reducing heat loss. For example, a multilayer, such as nickel-aluminum Ni/Al, can be grown by sputtering and evaporation. In any case, when the reactive material 300 is triggered by a current pulse, the stack of reactive material 300 reacts by spontaneous mixing to release a large quantity of heat through an exothermic reaction, without any pressure waves or gaseous byproducts.

In one embodiment, nickel/aluminum multilayers are used for the stack of reactive material 300, since such a reactive material can be ignited using a short, low-current electrical pulse. For example, a bilayer spacing $\lambda$ is frequently used to characterize the microstructure of a multilayer reactive material. For Ni/Al multilayers, the bilayer spacing $\lambda$ is defined as the thickness of one layer of nickel and one layer of aluminum (e.g., layer 310 and bottom layer 320 in FIG. 3). As one example, assuming a Ni/Al multilayer with a density of 5.09 g/cc, a heat capacity of 0.588 J/g/K, a resistivity of $1.3 \times 10^{-5}$ $\Omega$-cm and a 51 nm bilayer spacing, the ignition temperature is 177° C. In addition, assuming that 50m electrodes are used to supply an ignition current, a 100 ns 1.5 pA pulse is sufficient, assuming a lossless environment. However, estimating 80% heat loss, an approximately 3.3 pA pulse of 100 ns will ignite the Ni/Al (since electrical energy scales as the square of the current). Notably, the reaction of the reactive material to various currents of various durations can be tuned by changing the film thickness, bilayer spacing and chemistry, as well as through lithographic variation of the contact area to the reactive material structure, which will vary the current density.

In addition to Ni+Al multilayers, suitable reactive material components and combinations include: Si+2B, Cu+Pd, Al+Ti, Si+Co, Ni+Ti, Co+Al, Al+Pt, and combination of the foregoing as well as $Al_3Ni_2$, halfnium oxide, copper, copper oxide and various other metal and/or metal oxide material platforms already used in metal oxide semiconductor manufacturing. It should be noted that the foregoing is provided by way of example only and not limitation. Thus, numerous other, further and different combinations of component materials may be incorporated into a multilayer reactive material in accordance with various embodiments of the present disclosure. Some exemplary reactive materials that may be used in embodiments of the present disclosure are described in "A Survey of Combustible Metals, Thermites, and Intermetallics for Pyrotechnic Applications", by S. H. Fischer and M. C. Grubelich, Sandia National Laboratories, $32^{nd}$ AIAA/ASME/SAE/ASEE Joint Propulsion Conference, Lake Buena Vista, Fla., 1996, which is incorporated by reference herein in its entirety. In this regard, it should be noted that although some embodiments describe a reactive material that comprises a multi-layer stack, the present disclosure is not so limited. Namely, in other, further and different embodiments, the reactive material may comprise a single layer or region of a single metal or other material, or may comprise a different mechanism for generating heat, such as a thermite mixture, a metal fuel (e.g., a metal oxidation reaction), an intermetallic arrangement other than a multi-layer stack, and the like. In other words, some embodiments may feature an intermetallic reaction whereas other embodiments may rely upon an exothermic reduction-oxidation reaction, or other mechanism to generate heat.

Reactions in such materials can be ignited by ignition fluencies in the range of, for example, 0.5-5 $J/cm^2$, for an approximately 100 µm spot size, or 5-900 $J/cm^2$, for an approximately 10 µm spot size (the size of electrical contacts delivering an ignition current). Typical interlayer/bilayer spacing is from approximately 2 nm to 200 nm. Reactive materials such as the above can produce heats of reaction ranging from approximately 150 calories per cubic centimeter (cal/cc) to approximately 2500 cal/cc or more. Exemplary multilayer reactive materials have been show to ignite at temperatures below 300° C. under certain conditions (e.g., Ni+Al), but can produce heat greater than 600° C. up to more than approximately 2800° C. Given that a phase change memory's amorphous state can be made crystalline at temperatures of approximately 400° C. (for an approximately 100 ns pulse), and that there are typically greater than 1000 PCM cells on a chip, the energy to ignite a reactive material is far less that that required to resistively heat each cell individually.

In addition, in various embodiments an exothermic reaction of the reactive material is triggered by a current from a photovoltaic cell. However, in various other, further and different embodiments, such an exothermic reaction can be triggered by a number of other mechanisms. For example, the reactive material may also be ignited by a mechanical impact, sectioning of the chip, a direct energy source (such as radiation from a laser or x-ray, a focused ion beam, etc.), a direct thermal heating, a current from another source, such as another type of tampering detector (e.g., a wire mesh surrounding the chip, and others). In one embodiment, the reactive material is ignited by a current directed to the reactive material by a software program. For example, the reactive material may be incorporated in an integrated circuit of a computer. A software program running on the computer may be configured to cause an electrical signal to be sent to the reactive material if a number of incorrect password login attempts exceeds a threshold, thereby triggering a reaction.

Various embodiments described herein relate to the use of reactive materials in conjunction with phase change memory. Depending upon the configuration of reactive material (e.g., component metal(s)/materials, dimensions, size of contact areas, anticipated tampering techniques, and hence expected ignition currents, etc.), the phase change memory (PCM) can be tuned for optimal use with the reactive material. For example, the doping level can be varied to change the PCM sensitivity to the heat of reaction of the reactive material.

In some embodiments, a reactive material is used in conjunction with CMOS based memory technology. For example, reactive materials may generate heat greater than approximately 1300° C., which is sufficient to cause device damage through reactions with dielectrics such as silicon oxide, silicon nitride and high-k/metal gate dielectrics. For instance, metals such as aluminum strongly react with oxygen to form stable oxides. In one embodiment, a reactive material is integrated between the N and P wells of a CMOS gate. As such, the heat from a reaction in the reactive material causes a short due to the destruction of the gate dielectric, causing the circuit element to discharge and thereby irreversibly erasing the state of the memory bit.

Figure 4:
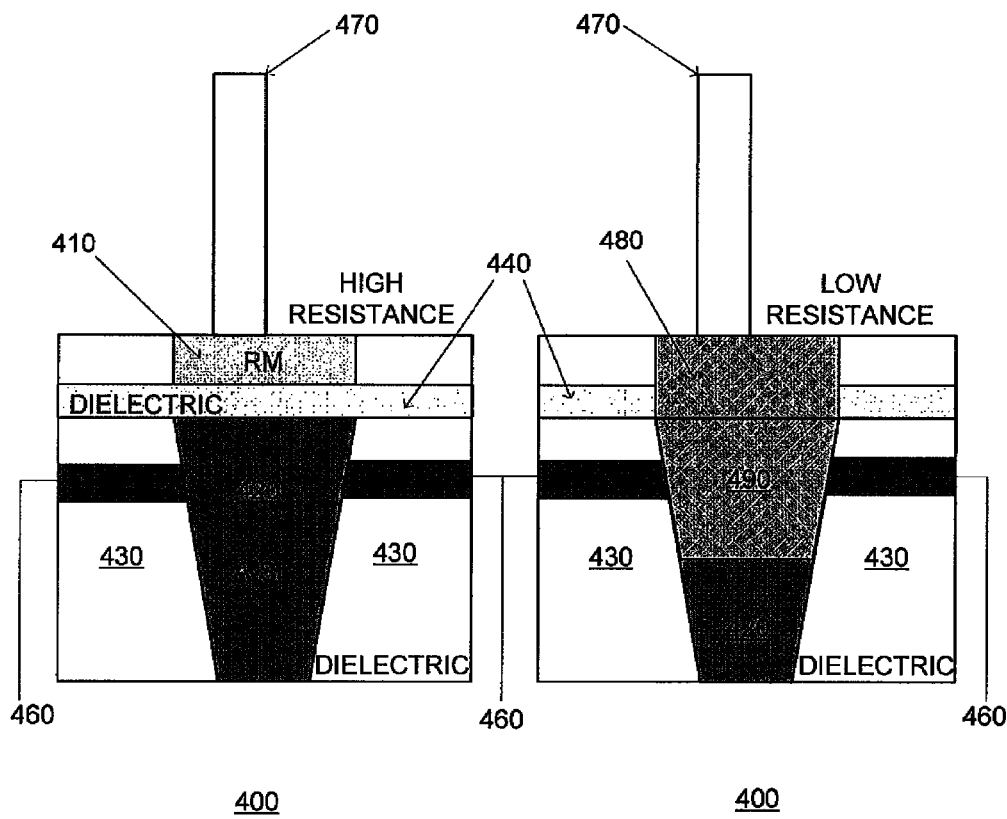
FIG. 4 illustrates an exemplary anti-fuse, e.g., an arming switch, according to embodiments of the present disclosure.

FIG. 4 illustrates an exemplary anti-fuse 400 according to various embodiments of the present disclosure. In particular, the left side of FIG. 4 illustrates the anti-fuse 400 in a high-resistance or "activated" state and the right side of FIG. 4 illustrates the anti-fuse 400 in a low-resistance, or "de-activated" state. In one embodiment, the anti-fuse comprises an aiming switch. For instance, such an anti-fuse deployed as an arming switch may be placed in an activated state between a photovoltaic cell and a region of reactive material. The activated state prevents current flow via an electrical path 460 from the photovoltaic cell to the region of reactive material and/or to at least one memory cell during fabrication of an integrated circuit/die. For example, as shown in FIG. 1, anti-fuse 190 (e.g., an arming switch) is situated in an electrical path between, and is coupled to both the photovoltaic cells 170 and reactive material 180 (e.g., by way of vias 140 and/or traces 150). Once the integrated circuit/die is finished, a one-time deactivation is performed to convert a material in the anti-fuse 190 having a high resistance to a low resistance state by an irreversible reaction thereby allowing a current to flow through the material in the low resistance state.

As illustrated in FIG. 4, the exemplary anti-fuse 400 includes a substrate 420, e.g., patterned or unpatterned amorphous silicon, which may be doped or undoped, or polycrystalline or crystalline silicon (monocrystal), surrounded by an insulator/dielectric 430. The anti-fuse 400 also includes a reactive material 410 atop a thin layer 440. The layer 440 may comprise the same material as insulator/dielectric 430. For example, layer 440 may comprise a dielectric layer. In one embodiment, the layer 440 comprises a non-metal such as at least one of: silicon oxide (SiO), silicon nitride ($Si_3N_4$), aluminum oxide ($Al_2O_3$), hafnium oxide ($HfO_2$), titanium dioxide ($TiO_2$), lanthanum aluminum oxide ($LaAlO_3$) or other metal oxide, or a combination thereof. In various embodiments, the layer 440 is thin enough to be consumed during a reaction of the reactive material 410, but provides sufficient electrical insulation from the reactive material 410 to the high resistance material (i.e., the substrate 420) before triggering the reaction, since current could otherwise flow through anti-fuse 400. For example, when anti-fuse 400 is used as an arming switch (e.g., between a photovoltaic cell and a region of reactive material) any current flowing from the photovoltaic cell to the region of reactive material could cause the erasure of any connected non-volatile memory cell(s). Accordingly, in some embodiments the insulating properties of such layer may be of lesser importance than its ability to facilitate an intermixing between a metal of the reactive material and the silicon substrate 420.

In one embodiment, the reactive material 410 takes the form of the exemplary reactive material 300 described above. In one embodiment, the anti-fuse 400 is directly connected to a dedicated external connection 470 (such as a C4 solder bump) which provides a way to direct a one-time deactivation signal to the anti-fuse 400. For example, an electrical current may be applied to the reactive material 410 causing an exothermic reaction in the reactive material 410 (e.g., an intermetallic reaction, an exothermic reduction-oxidation reaction, or the like), which in turn causes the substrate 420 (and/or the insulating layer 440) to change from a high resistance state to a low resistance state. In particular, the right side of FIG. 4 illustrates the anti-fuse 400, including the byproducts of the reaction of the reactive material 410, as well as the substrate in low resistance state 490. For example, where the substrate comprises amorphous silicon, the heat from the reactive material 410 affects the crystallization of the amorphous silicon 420 leading to a change or transition from high resistance 420 to low resistance 490. In other words, in one embodiment, the heat of the reaction causes crystallization of the amorphous silicon. In one embodiment, the substrate 420 comprises doped amorphous silicon. For example, in one embodiment the amorphous silicon substrate 420 is doped with one or more group IV (also referred to as group 14) elements, such as germanium or carbon, or a combination thereof, Alternatively, or in addition, in one embodiment the silicon substrate comprises additional impurities such as potassium (P), boron (B), arsenic (As), or a combination thereof, or hydrogen, helium, deuterium, or a combination thereof, and the like.

In one embodiment, the substrate 420 comprises amorphous silicon doped with one or more impurity metals, such as aluminum (Al), nickel (Ni), copper (Cu) or a combination thereof, in order to lower the required energy for crystallization through a metal induced crystallization (MIC) process. For instance, the metallic impurities may provide one or more nucleation sites for crystal formation. In one embodiment, the amorphous silicon is graded, e.g., where the dopants/impurities are not evenly distributed throughout the substrate 420. For instance, a greater level of dopants/impurities may be contained in parts of the substrate 420 that are nearer to the reactive material 410 and less or no dopants/impurities may be contained in parts of the substrate that are further away from the reactive material. Alternatively, or in addition, the reaction of the reactive material 410 can induce silicide formation, which also leads to a change in resistance. For example, one or more metals from the reactive material 410 may combine with the substrate 420 (e.g., amorphous silicon or crystalline/polycrystalline silicon) to form a conductive silicide layer. As such, the substrate in low resistance state 490 may comprise a silicide layer. In still another embodiment, the reaction of the reactive material 410 comprises one or more metals of the reactive material 410 mixing with or diffusing into the substrate 420 to form a conductive silicon layer 490 with metallic impurities. In one embodiment, the layer 440 is consumed as part of the reaction between the reactive material/metal and the silicon substrate 420. In one embodiment, the layer 440 acts as a diffusion barrier which, at some minimum threshold temperature, allows metal from the reactive material 410 to pass through. Alternatively, or in addition, in one embodiment, the layer 440 may also facilitate the mixing process between the reactive material/metal and the silicon substrate 420.

Although FIG. 4 illustrates only a single region of reactive material 410 on one side of the substrate 420, in other embodiments multiple regions of reactive material may be used in a single anti-fuse. For example, a second region of reactive material may be placed under the amorphous silicon substrate 420 as illustrated in FIG. 4. Alternatively or in addition, one or more other regions of reactive material may be placed around the amorphous silicon substrate 420 in various orientations (e.g., to the left and the right). In addition, one or more further layers of thin insulators/dielectrics may be situated between the additional regions of reactive material and the substrate 420. Likewise, one or more additional dedicated external connections may be provided to allow delivery of an electrical flow or current to the one or more additional regions of reactive material. Further, although FIG. 4 appears to illustrate an anti-fuse 400 in a horizontal orientation, the present disclosure is not so limited. In other words, the anti-fuse may have any orientation within and with respect to the integrated circuit and may be fabricated within or as part of any one or more layers if the integrated circuit.

Notably, to directly cause a state change in the substrate 420 via an electrical current, a relatively high current is required. Advantageously, using embodiments of the present disclosure a relatively low current delivered to the reactive material can generate a high heat sufficient to cause a state change in the substrate 420 avoiding the need for a large direct current to alter the substrate 420. Thus, novel anti-fuses/ arming switches are described herein where the reactive material 410 acts as a low power heater for delivering the required energy for crystallization of the amorphous silicon substrate 420. However, in accordance with one embodiment of the present disclosure a system may nevertheless comprise a photovoltaic cell and/or a region of reactive material coupled via an electrical path having an arming switch that is deactivated conventionally, e.g., by an electrical current applied to the substrate.

Figure 5:
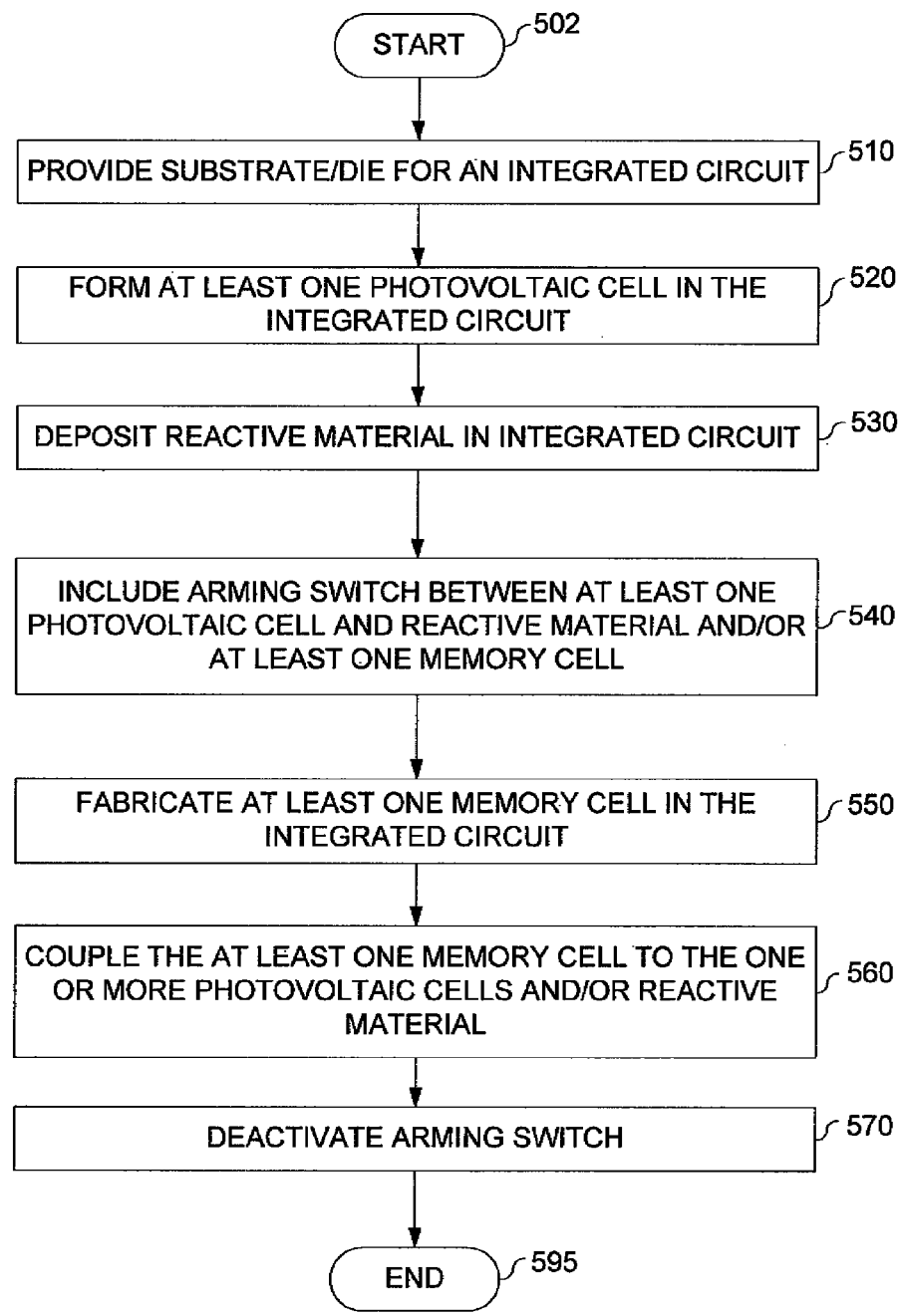
FIG. 5 is a flowchart of a method for manufacturing an exemplary device, according to embodiments of the present disclosure.

FIG. 5 illustrates a flowchart of a method 500 for manufacturing an integrated circuit having a tamper response device. In particular, exemplary steps of the method 500 may be performed in accordance with any one or more of the above described embodiments.

The method 500 begins at step 502 and proceeds to step 510 where the method provides a substrate/die. For example, a substrate/die may be the basis for at least one integrated circuit, each of which may comprise a front end layer of semiconducting silicon, gallium arsenide, germanium and the like, along with other materials and/or combinations thereof, and having formed therein a number of transistors, gates, nets, and the like. The integrated circuit may also comprise a number of backend layers including a dielectric (e.g., a low-k dielectric) or other insulating materials, vias, traces, and wiring connecting various elements in the front end to each other, to ground, and to power sources, among other things. An exemplary integrated circuit is illustrated in FIG. 1 and described above.

At step 520, the method 500 forms at least one photovoltaic cell on or in the at least one integrated circuit. For example, the photovoltaic cell may be formed using any number of known techniques. For example, exemplary materials that may be used for a photovoltaic cell can be deposited using electron beam induced deposition, a focused ion beam induced deposition, sputtering, evaporation and similar techniques, and may be further formed using a lithography process, laser anneal, reactive ion etching, chemical mechanical planarization, and other MOS processing techniques. In some embodiments, multiple photovoltaic cells are included at various layers and at various locations, random or otherwise, in the backend, or front end, of the integrated circuit. As such, different photovoltaic cells included in the integrated circuit may be formed at different times as each of the layers of the integrated circuit is fabricated. In this regard, it should be noted that any one or more of the steps of the method 500 may be repeated or performed in a different order than as explicitly depicted in FIG. 5. In some embodiments, multiple photovoltaic cells are formed at step 520 having different sizes, geometries, configurations or materials/compositions, resulting in different response from one another in response to various tampering techniques (e.g., different quantum efficiencies when exposed to the same wavelength radiation).

In various embodiments, a tamper response device includes a reactive material and an anti-fuse, or arming switch, to prevent the flow of current between the at least one photovoltaic cell and the reactive material. Thus, in some embodiments, following step 520 the method 500 simply proceeds to step 550. However, in some embodiments, either or both of steps 530-540 of the method 500 may be performed following step 520.

At step 530, the method 500 deposits, or forms a reactive material in the integrated circuit. Exemplary reactive materials are described above in connection with FIGS. 1 and 3. As with the photovoltaic cells formed at step 520, the reactive material can be deposited and formed using electron beam induced deposition, a focused ion beam induced deposition, sputtering, evaporation and similar techniques, and may be further formed using a lithography process, laser anneal, reactive ion etching, chemical mechanical planarization, and other MOS processing techniques. In addition, the reactive material can be formed at a single location or multiple distributed locations, and can take various shapes, patterns and geometries depending upon the particular configuration of the integrated circuit. For example, the reactive material can be placed in various layers and at various locations, random or otherwise, in the backend, or front end, of the integrated circuit. In one embodiment, the method 500 couples the reactive material to the at least one photovoltaic cell. For example, the reactive material and the at least one photovoltaic cell may be electrically coupled through one or more vias and/or traces, and the like.

At step 540, the method 500 includes at least one anti-fuse, or arming switch, between at least one photovoltaic cell and the reactive material and/or one or more memory cells (which, in some embodiments, may be yet to be formed). For example, as the integrated circuit, and the backend in particular, is formed, copper or other conductive wiring may be formed in vias and traces connecting devices such as gates, transistors, and the like with one another. In some embodiments, an exemplary tamper response device comprises at least one photovoltaic cell formed at step 520 and the reactive material deposited at step 530. The photovoltaic cell(s) may be connected to the reactive material by this backend wiring. However, as additional layers are added to the integrated circuit and as the manufacturing process of the integrated circuit continues, the photovoltaic cell(s) will continue to be exposed to radiation including visible light, irradiation from lasers (e.g., due to laser anneal of other components), and others forms of radiation. As such, it is possible for the photovoltaic cell to trigger a reaction in the reactive material if directly connected through backend wiring, or to directly affect one or more memory cells of a non-volatile memory. As such, an anti-fuse, or arming switch, may be included at step 540 between the photovoltaic cell(s) and the reactive material and/or one or more memory cells. The arming switch may be placed in the path of a backend wiring connection between one or more of the photovoltaic cells and the reactive material and/or memory cells to prevent the flow of current during additional steps of manufacturing the integrated circuit. Exemplary anti-fuses, aiming switches and suitable components are described above in connection with FIGS. 1 and 4. The anti-fuse, or arming switch, may be fabricated using any of the same techniques described above in connection with steps 520 or 530, or other similar MOS fabrication techniques.

At step 550, the method 500 fabricates at least one memory cell in the integrated circuit. The at least one memory cell can be fabricated using any of the same techniques described above in connection with steps 520-540, or other similar MOS fabrication techniques. The at least one memory cell may comprise one or more gates/transistors that form a non-volatile memory, such as static random access memory formed of metal oxide semiconductors (MOS) transistors, high-k/metal gates, and the like, or read only memory (ROM), phase change memory (PCM), and the like.

At step 560, the method 500 connects the at least one memory cell to the photovoltaic cell(s) and/or reactive material. For example, electrical coupling(s) may be made between such components through wiring in the vias and traces in the backend of the integrated circuit. Note that as the fabrication of an entire integrated circuit generally involves a layer-by-layer process, only certain portions of the wiring connections, as well as the components to be connected, may be deposited or formed in connection with each layer. As subsequent layers are added to the integrated circuit, additional portions of the wiring connections, vias, traces, gates, dielectric insulators, and other components may additionally be created. Thus, it should be understood that any one or more of the steps of the method 500 may be repeated (e.g., for depositing/forming additional portions of an anti-fuse, memory cell, reactive material or photovoltaic cell as each layer of the integrated circuit is manufactured) or performed in a different order than as explicitly depicted in FIG. 5.

The photovoltaic cell(s), or the photovoltaic cell(s) in conjunction with the reactive material, comprise a tamper response device for the integrated circuit. Radiation from tampering/probing techniques that are received at the photovoltaic cell(s) generate a photocurrent from the photovoltaic cell(s) to the reactive material or directly to the at least one memory cell. The direct photocurrent, or heat from an exothermic reaction in the reactive material erases or changes a state of the at least one memory cell, preventing extraction of any data previously stored in the at least one memory cell.

Following step 560, the method 500 may further proceed to step 570. In particular, if the method 500 included an anti-fuse at step 540, the anti-fuse must then be deactivated before the tamper response device (i.e., the photovoltaic cell(s), or the photovoltaic cell(s) plus reactive material) is functional. In one embodiment, the anti-fuse is directly connected to a dedicated external connection (such as a C4 solder bump) which provides a way to direct a one-time deactivation signal to the anti-fuse. For example, in one embodiment the heat from a small reactive material in the anti-fuse affects the crystallization of a region of doped amorphous silicon leading to a phase change from high resistance to low resistance. The heat-generating reaction is set off by the deactivation signal. Alternatively, or in addition, the reaction of the reactive material in the anti-fuse can induce silicide formation and/or a mixing of a metal from the reactive material in the arming switch with a silicon substrate, which also leads to a change in resistance. In any case, once the anti-fuse is placed in a low resistance state, a path exists for a current to flow between the photovoltaic cell(s) formed at step 520 and the reactive material deposited at step 530, through wiring in the vias and traces of the integrated circuit, as well as through the (deactivated) anti-fuse) that was placed in the path at step 540.

At step 595, the method 500 ends. Accordingly, the steps of the method 500 produce a secure integrated circuit that includes a tamper response device.

Figure 6:
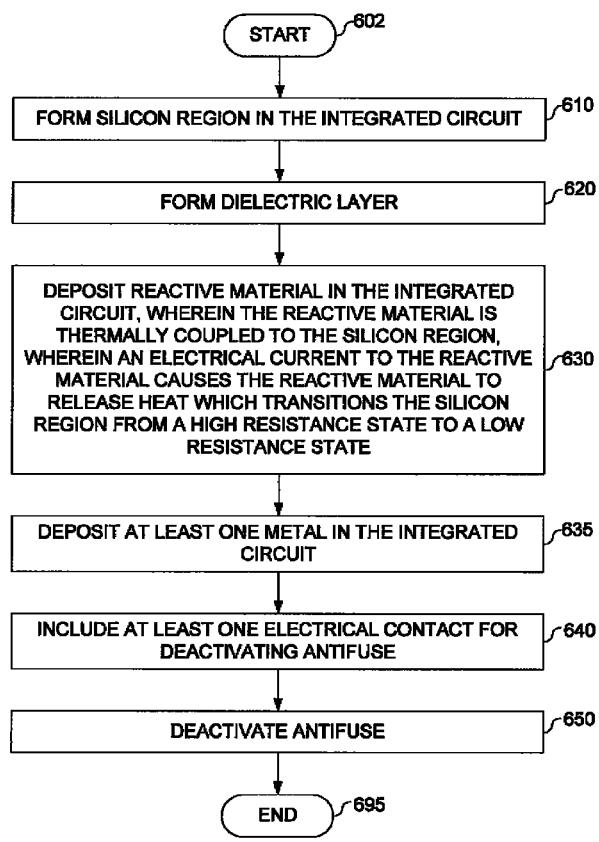
FIG. 6 is a flowchart of a method for manufacturing an exemplary anti-fuse, e.g., an arming switch, according to embodiments of the present disclosure.

FIG. 6 illustrates a flowchart of a method 600 for manufacturing an anti-fuse, e.g., an arming switch, for an integrated circuit in accordance with the present disclosure. In particular, exemplary steps of the method 600 may be performed in accordance with any one or more of the above described embodiments.

The method 600 begins at step 602 and proceeds to step 610 where the method forms a silicon region in the integrated circuit. For example, a silicon region, such as substrate 420 as described above in connection with FIG. 4, may be formed in the integrated circuit. For instance, the silicon region may comprise an amorphous silicon substrate or crystalline/polycrystalline silicon. In one embodiment, the silicon region is formed/deposited in a high resistance state. In addition, in one embodiment, the silicon region includes one or more dopants or other impurities such as described above in connection with FIG. 4.

Following step 610, the method 600 may proceed to step 620 where the method forms a layer over the silicon region. For example, a dielectric layer may be formed substantially as layer 440 is shown in FIG. 4, or may take a different arrangement depending upon the location, orientation or other characteristic of the silicon region.

At step 630 the method 600 deposits a reactive material in the integrated circuit. For example, a region of reactive material may be formed in substantially the same manner as described above in connection with step 530 of the method 500. However, in this case the first region of reactive material is not intended for destroying or altering a memory cell, but is for inclusion in an anti-fuse for delivering sufficient heat to change the silicon region from a high resistance state to a low resistance state. Further at step 630, the first region of reactive material may be deposited such that it is coupled to the silicon region. For example, the reactive material may be thermally coupled to the silicon region, e.g., where the reactive material and silicon region are sufficiently close to one another on the chip such that a heat from an exothermic reaction in the reactive material will cause a desired change in the state of the silicon region (e.g., changing from a high resistance state to a low resistance state). Thus, the reactive material and the silicon region may be touching, or may be coupled via one or more additional layers or other intervening regions. For example, in one embodiment, the dielectric layer is situated between the reactive material and the silicon region. Nevertheless, the reactive material and silicon region remain thermally coupled. For example, the dielectric layer is thin enough to be consumed during a reaction of the first region of reactive material, but provides sufficient electrical insulation from the first region of reactive material to the dielectric region before triggering the reaction.

In one embodiment, following step 630, the method 600 may proceed to step 635 where the method deposits at least one metal in the integrated circuit. For example, in one embodiment a separate metal layer may be deposited adjacent to the silicon region. In one embodiment, the at least one metal comprises nickel, aluminum, titanium, copper, platinum cobalt or tungsten. Notably, the at least one metal may react or interact with the silicon region when heated by a heat from the reactive material to form a silicide or to otherwise mix with the silicon region such that the silicon region transitions to a low resistance state. It should also be noted that in one embodiment, the at least one metal comprises part of the reactive material deposited at step 630. For example, the at least one metal may comprise one of the metals that is used in a thin-metal film or other intermetallic reactive material. As such, in some embodiments step 635 may be considered a sub-step of step 630.

Following step 630 and/or step 635, the method 600 may proceed to step 640 where the method includes at least one electrical contact for conveying a deactivation signal to the anti-fuse. For example, an electrical contact such as electrical contact 470 may be formed in accordance with the integrated circuit manufacturing process.

Following step 640, the method 600 may proceed to step 650 where the method deactivates the anti-fuse, or arming switch. For example, an external current from a dedicated connection may deliver sufficient energy to trigger an exothermic reaction in the reactive material. In one embodiment, the external current is delivered via the at least one electrical contact formed at step 640. It should be noted that step 650 may comprise substantially the same process as described above in connection with step 570 of the method 500. In addition, the exothermic reaction may follow any of the above described processes (e.g., an intermetallic reaction, an exothermic reduction-oxidation reaction, etc.) and may cause the silicon region to change from a high resistance state to a low resistance state through any of the above described processes (e.g., a change from amorphous silicon to crystalline silicon and/or a metal induced crystallization process, silicide formation, etc.).

At step 695 the method ends. Accordingly, the steps/operations/functions of the method 600 produce a secure integrated circuit that includes an antifuse.

Although the methods 500 and 600 have been described in connection with certain exemplary materials, in other, further and different embodiments, at steps 510-550 and steps 610-680 respectively the methods 500 and 600 may use alternative materials suitable for use as a substrate, photovoltaic cells, reactive materials, anti-fuses/arming switches, memory cells, including gates, transistors and sub-components, and other components, such as wiring, backend insulating dielectrics, and the like. In addition, it should be noted that in various embodiments it is not strictly necessary that each and every step depicted in the respective methods 500 and 600 be performed. In other words, any one or more of the steps of the respective methods 500 and 600 may be deemed optional steps. Similarly, although the steps of the respective methods 500 and 600 are listed in a particular order, as shown in FIGS. 5 and 6, it should be noted that alternate embodiments of the present disclosure may implement these steps in a different order or may repeat such steps as necessary (e.g., as different layers of the integrated circuit are formed).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents. In addition, although various embodiments which incorporate the teachings of the present disclosure have been shown and described in detail herein, those skilled in the art can readily devise many other varied embodiments that still incorporate these teachings.

What is claimed is:

1. An integrated circuit having a tamper detection and response device, comprising:
   at least one reactive material; and
   at least one memory cell coupled to the at least one reactive material, wherein an exothermic reaction in the at least one reactive material causes an alteration to a memory state of the at least one memory cell.

2. The integrated circuit of claim 1, wherein the alteration comprises a destruction of the at least one memory cell.

3. The integrated circuit of claim 1, wherein the at least one memory cell comprises a phase change memory or a metal oxide semiconductor based memory.

4. The integrated circuit of claim 1, wherein a current triggers the exothermic reaction in the at least one reactive material in the integrated circuit.

5. The integrated circuit of claim 1, wherein a heat generated by the exothermic reaction in the at least one reactive material causes the alteration to the memory state of the at least one memory cell.

6. The integrated circuit of claim 1, wherein the at least one reactive material comprises a thin metal film.

7. The integrated circuit of claim 1, wherein the at least one reactive material comprises at least one of nickel, aluminum, titanium, copper, copper oxide, hafnium oxide, cobalt silicon, titanium boron or palladium.

8. The integrated circuit of claim 1, further comprising an arming switch, the arming switch preventing a flow of current to the at least one reactive material until the arming switch is deactivated.

9. The integrated circuit of claim 1, wherein the at least one reactive material is distributed in two or more locations within the integrated circuit.

10. The integrated circuit of claim 1, further comprising at least one photovoltaic cell.

11. The integrated circuit of claim 10, wherein when the at least one photovoltaic cell is exposed to radiation, the at least one photovoltaic cell generates a current that triggers the exothermic reaction in the at least one reactive material.

12. The integrated circuit of claim 1, wherein at least one of the at least one reactive material is located in an interconnect structure of the integrated circuit.

13. The integrated circuit of claim 1, wherein an exposure to radiation causes the exothermic reaction in the at least one reactive material.

14. The integrated circuit of claim 1, wherein dimensions of the reactive material are such that the exothermic reaction in the reactive material causes the alteration of the memory state of the at least one memory cell.

15. A method for manufacturing an integrated circuit having a tamper detection and response device, comprising:
    forming at least one reactive material in the integrated circuit;
    fabricating at least one memory cell in the integrated circuit; and
    coupling the at least one reactive material to the at least one memory cell, wherein an exothermic reaction in the at least one reactive material causes an alteration to a memory state of the at least one memory cell.

16. The method of claim 15, wherein the alteration comprises a destruction of the at least one memory cell.

17. The method of claim 15, wherein the at least one memory cell comprises a phase change memory.

18. The method of claim 15, further comprising:
    including at least one photovoltaic cell in the integrated circuit.

19. The method of claim 18, wherein when the at least one photovoltaic cell is exposed to radiation, the at least one photovoltaic cell generates a current that triggers an exothermic reaction in the reactive material.

20. The method of claim 18, further comprising:
    including an arming switch between the at least one photovoltaic cell and the reactive material for preventing a flow of current between the at least one photovoltaic cell and the reactive material; and
    deactivating the arming switch.

21. The method of claim 15, wherein the forming the at least one reactive material comprises forming a plurality of regions of the at least one reactive material in two or more locations within the integrated circuit.

22. An integrated circuit having a tamper detection and response device, comprising:
    a substrate;
    at least one gate on the substrate;
    and a reactive material between a first well and a second well of the at least one gate, wherein a reaction in the reactive material causes a short in the gate.

23. The integrated circuit of claim 22, wherein the gate comprises a metal oxide semiconductor gate.

24. A method for manufacturing an integrated circuit having a tamper detection and response device, comprising:
    forming at least one gate on a substrate of the integrated circuit;
    depositing a reactive material between a first well and a second well of the gate, wherein a reaction in the reactive material causes a short in the gate.

* * * * *